(12) United States Patent
Joo et al.

(10) Patent No.: US 11,961,812 B2
(45) Date of Patent: Apr. 16, 2024

(54) SEMICONDUCTOR PACKAGES HAVING VIAS

(71) Applicant: Samsung Electronics Co., Ltd., Suwon-si (KR)

(72) Inventors: Changeun Joo, Cheonan-si (KR); Gyujin Choi, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/170,857

(22) Filed: Feb. 17, 2023

(65) Prior Publication Data

US 2023/0207508 A1 Jun. 29, 2023

Related U.S. Application Data

(63) Continuation of application No. 16/947,093, filed on Jul. 17, 2020, now Pat. No. 11,587,898.

(30) Foreign Application Priority Data

Nov. 11, 2019 (KR) .......................... 10-2019-0143575

(51) Int. Cl.
*H01L 23/538* (2006.01)
*H01L 23/00* (2006.01)
*H01L 23/31* (2006.01)

(52) U.S. Cl.
CPC .......... *H01L 24/17* (2013.01); *H01L 23/3135* (2013.01); *H01L 23/5384* (2013.01); *H01L 24/13* (2013.01); *H01L 2224/13008* (2013.01); *H01L 2224/13009* (2013.01); *H01L 2224/13023* (2013.01)

(58) Field of Classification Search
CPC ....................................................... H01L 24/17
See application file for complete search history.

(56) References Cited

U.S. PATENT DOCUMENTS

| | | | |
|---|---|---|---|
| 6,815,324 B2 | 11/2004 | Huang et al. | |
| 9,048,233 B2* | 6/2015 | Wu | H01L 21/486 |
| 9,111,949 B2* | 8/2015 | Yu | H01L 21/561 |
| 9,281,254 B2* | 3/2016 | Yu | H01L 24/97 |
| 9,607,967 B1* | 3/2017 | Shih | H01L 21/6835 |
| 9,640,500 B2 | 5/2017 | Yoshida et al. | |
| 9,935,068 B2 | 4/2018 | Ban et al. | |
| 10,157,888 B1* | 12/2018 | Lin | H01L 21/6835 |
| 10,199,551 B2 | 2/2019 | Kim et al. | |
| 2002/0111009 A1 | 8/2002 | Huang et al. | |
| 2017/0365567 A1 | 12/2017 | Kim et al. | |
| 2018/0366411 A1 | 12/2018 | Suk et al. | |
| 2019/0252305 A1 | 8/2019 | Peng et al. | |

* cited by examiner

*Primary Examiner* — William A Harriston
(74) *Attorney, Agent, or Firm* — Myers Bigel, P.A.

(57) ABSTRACT

A semiconductor package includes a lower redistribution layer including an insulating pattern having an opening and a via in the opening; a first semiconductor chip including a chip pad, a passivation layer, and a pad bump connected to the chip pad; and a first encapsulant on the lower redistribution layer and the first semiconductor chip. The opening defines a lower surface and a side surface of the pad bump, and the via is in physical contact with the lower surface and the side surface of the pad bump.

20 Claims, 10 Drawing Sheets

800

SEMICONDUCTOR PACKAGES HAVING VIAS

CROSS-REFERENCE TO RELATED APPLICATION

This U.S. non-provisional application is a continuation of U.S. patent application Ser. No. 16/947,093, filed Jul. 17, 2020, which claims priority, under 35 U.S.C. § 119 to Korean Patent Application No. 10-2019-0143575, filed Nov. 11, 2019, the disclosures of which are incorporated herein by reference in their entirety.

BACKGROUND

1. Field

Devices consistent with example embodiments relate to semiconductor packages having vias.

2. Description of Related Art

In accordance with the demand for miniaturization of semiconductor devices, miniaturization of each component in a semiconductor package may be required. As a result, the bonding reliability of a semiconductor chip may be diminished.

SUMMARY

According to some example embodiments, a semiconductor package may comprise a lower redistribution layer including an insulating pattern having an opening and a via in the opening; a first semiconductor chip on the lower redistribution layer, the first semiconductor chip including a chip pad, a passivation layer, and a pad bump, the pad bump extending through the passivation layer and being connected to the chip pad; and a first encapsulant on the lower redistribution layer and the first semiconductor chip. The opening may define a lower surface and a side surface of the pad bump, and the via may be in physical contact with the lower surface and the side surface of the pad bump.

According to some example embodiments, a semiconductor package may comprise a lower redistribution layer including an insulating pattern having a first opening and a second opening, a first via in the first opening, and a second via in the second opening; a first semiconductor chip on the lower redistribution layer, the first semiconductor chip including a chip pad, a passivation layer, and a pad bump, the pad bump extending through the passivation layer and being connected to the chip pad; a first encapsulant on the lower redistribution layer and the first semiconductor chip, and a connection member on the lower redistribution layer adjacent to the first semiconductor chip, the connection member including an insulating layer and a conductive pad between the insulating layer and the lower redistribution layer. The first opening may define a lower surface and a side surface of the pad bump. The first via may be in physical contact with the lower surface and the side surface of the pad bump. The second opening may define a lower surface and a side surface of the conductive pad. The second via may be in physical contact with the insulating layer and the lower surface and the side surface of the conductive pad.

According to some example embodiments, a semiconductor package may comprise a lower package. The lower package may comprise a lower redistribution layer including an insulating pattern having an opening and a via in the opening; a first semiconductor chip on the lower redistribution layer, the first semiconductor chip including a chip pad, a passivation layer, and a pad bump, the pad bump extending through the passivation layer and being connected to the chip pad; a connection member on the lower redistribution layer adjacent to the first semiconductor chip; a first encapsulant on the lower redistribution layer and the first semiconductor chip; and an upper redistribution layer on an upper surface of the first encapsulant and electrically connected to the connection member. An upper package may be on the upper redistribution layer and may include a substrate, a second semiconductor chip, a second encapsulant, and a connection terminal. The opening may define a lower surface and a side surface of the pad bump. The via may be in physical contact with the lower surface and the side surface of the pad bump. The via may include a central protrusion in physical contact with the lower surface of the pad bump; and an outer protrusion in physical contact with a lower surface of the passivation layer and the side surface of the pad bump.

BRIEF DESCRIPTION OF THE DRAWINGS

The above and other objects, features, and advantages of inventive concepts will become more apparent to those of ordinary skill in the art by describing example embodiments thereof in detail with reference to the accompanying drawings, in which.

DETAILED DESCRIPTION OF EXAMPLE EMBODIMENTS

Figure 1:
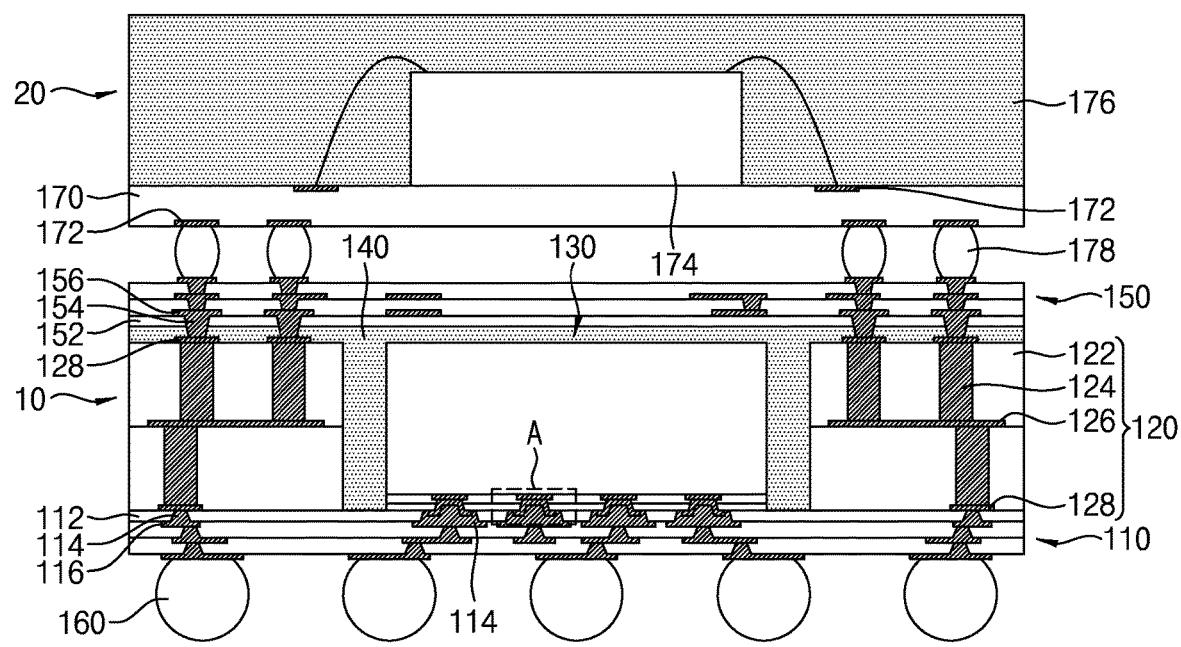
FIG. 1 is a cross-sectional view of a semiconductor package according to some example embodiments of the inventive concepts.

Hereinafter, embodiments of the inventive concepts will be described in detail with reference to the accompanying drawings. The same reference numerals are used for the same elements in the drawings, and redundant descriptions thereof will be omitted. As used herein, the term "and/or" includes any and all combinations of one or more of the associated listed items. It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It is noted that aspects described with respect to one embodiment may be incorporated in different embodiments although not specifically described relative thereto. That is, all embodiments and/or features of any embodiments can be combined in any way and/or combination.

FIG. 1 is a cross-sectional view of a semiconductor package according to some example embodiments of the inventive concepts.

Referring to FIG. 1, a semiconductor package 100 may include a lower package 10 and an upper package 20 disposed on the lower package 10. The lower package 10 may include a lower redistribution layer 110, a connection member 120, a semiconductor chip 130, an encapsulant 140, an upper redistribution layer 150, and an external connection terminal 160.

The lower redistribution layer 110 may include insulating patterns 112, vias 114, and wiring patterns 116. The insulating patterns 112 may be stacked in the vertical direction in the cross-sectional view of FIG. 1. The vias 114 may be disposed so as to extend through the insulating patterns 112. The wiring patterns 116 may be disposed between the insulating patterns 112 and may extend in the horizontal direction in the cross-sectional view of FIG. 1. The vias 114 may electrically connect the wiring patterns 116 of different layers and may be integrally formed with each of the corresponding wiring pattern 116. That is, a via 114 and its corresponding wiring pattern 116 may comprise a monolithic structure. The lower redistribution layer 110 may be connected to the connection member 120 and the external connection terminal 160.

The connection member 120 may be disposed on the lower redistribution layer 110. The connection member 120 may electrically connect the lower redistribution layer 110 and the upper redistribution layer 150. The connection member 120 may include an insulating layer 122, a conductive via 124, an internal wiring 126, and a conductive pad 128. The insulating layer 122 may be formed of one or more layers. The conductive via 124 may penetrate and extend through the insulating layer 122 in a vertical direction and may be connected to the internal wiring 126 and the conductive pad 128. The internal wiring 126 may be disposed between the insulating layers 122 and may electrically connect the conductive pads 128 through the conductive vias 124. The conductive pads 128 may be connected to the conductive via 124 and may be disposed on an upper surface or a lower surface of the connection member 120.

The semiconductor chip 130 may be disposed adjacent to the connection member 120 on the lower redistribution layer 110. The encapsulant 140 may be on and at least partially cover the lower redistribution layer 110, the connection member 120, and the semiconductor chip 130. In some example embodiments, the encapsulant 140 may include a thermosetting resin, such as an epoxy resin, a thermoplastic resin, such as polyimide, or a resin further including a reinforcing material, such as an inorganic filler therein, specifically, an Ajinomoto Build-up Film (ABF), FR-4, BT (Bismaleimide Triazine) resin and the like. In addition, molding materials, such as EMC, or photosensitive materials, such as PIE, may be used.

The upper redistribution layer 150 may be disposed on the encapsulant 140. The upper redistribution layer 150 may be formed of a plurality of layers, and may include insulating patterns 152, vias 154, and wiring patterns 156. The insulating pattern 152 of the upper redistribution layer 150 may be on and at least partially cover the upper surface of the encapsulant 140. The vias 154 may be formed through the insulating patterns 152 and may be electrically connected to the conductive pads 128 of the connection member 120. The wiring patterns 156 may be disposed between the insulating patterns 152 and may extend in the horizontal direction as shown in the cross-sectional view of FIG. 1.

The external connection terminal 160 may be disposed below the lower redistribution layer 110 and may extend therefrom. The external connection terminal 160 may be electrically connected to the connection member 120 and the semiconductor chip 130 through the lower redistribution layer 110. The external connection terminal 160 may have a ball shape and may include solder.

The upper package 20 may be disposed on the lower package 10. The upper package 20 may include a substrate 170, a semiconductor chip 174, an encapsulant 176, and a connection terminal 178. The substrate 170 may include connection pads 172 disposed on a lower surface and an upper surface thereof and electrically connected to each other. The semiconductor chip 174 may be mounted on the substrate 170. The semiconductor chip 174 may be electrically connected to the connection pad 172 of the substrate 170. The encapsulant 176 may be on and at least partially cover the substrate 170 and the semiconductor chip 174. The connection terminal 178 may be disposed below the substrate 170 and may be electrically connected to the connection pad 172. The lower package 10 may be electrically connected to the upper package 20 through the connection terminal 178.

Figure 2:
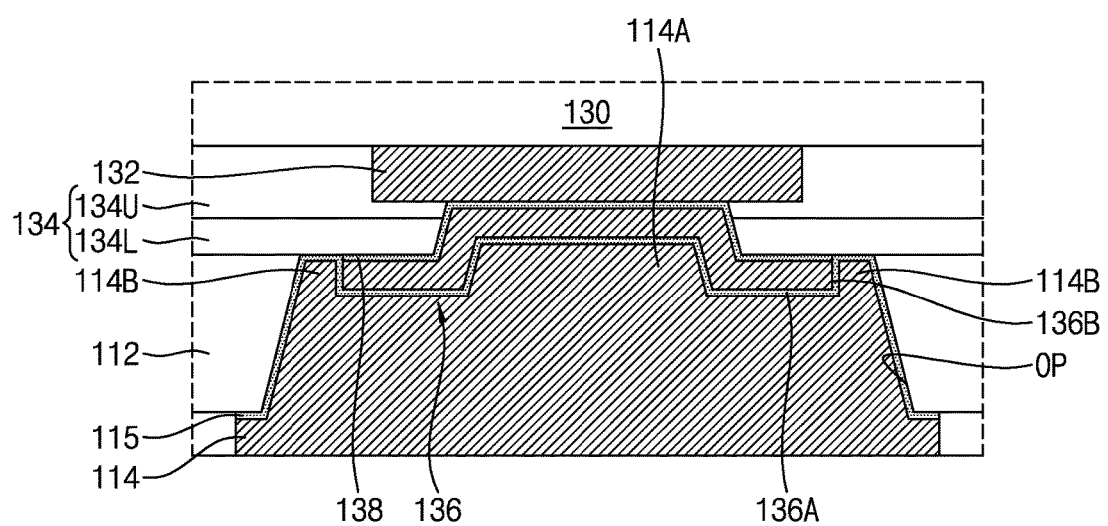
FIG. 2 is a partial enlarged view of the semiconductor package shown in FIG. 1.

FIG. 2 is a partial enlarged view of the semiconductor package 100 shown in FIG. 1. FIG. 2 may correspond to area A of FIG. 1.

Referring to FIG. 2, the semiconductor chip 130 may include a chip pad 132, a passivation layer 134, and a pad bump 136 on a lower surface thereof. The passivation layer 134 may include an upper passivation layer 134U and a lower passivation layer 134L. The upper passivation layer 134U may be on and at least partially cover a portion of a side surface and an upper surface of the chip pad 132, and the lower passivation layer 134L may be disposed below the upper passivation layer 134U in the cross-sectional view of FIG. 2. The upper passivation layer 134U and the lower passivation layer 134L may expose a portion of the lower surface of the chip pad 132. The pad bump 136 may be disposed below the lower passivation layer 134L and may be connected to a portion of the lower surface of the chip pad 132 through the upper passivation layer 134U and the lower passivation layer 134L. The pad bump 136 may include a seed layer 138 on its upper surface. The seed layer 138 may be conformally formed along the surfaces of the chip pad 132, the upper passivation layer 134U, and the lower passivation layer 134L. The horizontal width of the pad bump 136 in the cross-sectional view of FIG. 2 may be about 1 μm to about 51 μm.

The insulating pattern 112 of the lower redistribution layer 110 may be disposed below the lower passivation layer 134L in the cross-sectional view of FIG. 2 and may include an opening OP. The opening OP may open or define a lower surface 136A and a side surface 136B of the pad bump 136. In addition, the opening OP may open or define a portion of the lower surface of the lower passivation layer 134L. The via 114 may at least partially fill the opening OP and may physically contact pad bump 136. In some example embodiments, the via 114 may physically contact the lower surface 136A and side surface 136B of the pad bump 136. In addition, the via 114 may physically contact the lower surface of the lower passivation layer 134L. That is, the upper surface of the via 114 may be positioned at the same level as the lower surface of the lower passivation layer 134L. The via 114 may include a seed layer 115 on its upper surface. The seed layer 115 may be conformally formed along the upper surface of the via 114. The seed layer 115 may be on and at least partially cover the lower surface 136A and the side surface 136B of the pad bump 136 and may be on and at least partially cover a portion of the lower surface of the lower passivation layer 134L. The horizontal width of a portion of the via 114 in physical contact with the lower passivation layer 134L may be greater than the horizontal width of the pad bump 136 in the cross-sectional view of FIG. 2. The via 114 may include protrusions on its upper surface. In some example embodiments, the via 114 may include a central protrusion 114A and an outer protrusion 114B. The central protrusion 114A may physically contact the pad bump 136, and the outer protrusion 114B may physically contact the lower surface of the lower passivation layer 134L and the side surface of the pad bump 136.

In some example embodiments, the pad bump 136 may be omitted and the via 114 may penetrate and extend through the passivation layer 134 so as to be connected with the chip pad 132. For example, the via 114 may have a horizontal width that is greater than the horizontal width of the exposed portion of the chip pad 132 in the cross-sectional view of FIG. 2.

As shown in FIG. 2, the via 114 may physically contact the side surface 136B as well as the lower surface 136A of the pad bump 136. The semiconductor package 100, according to some example embodiments of inventive concept, may have a large area where the via 114 physically contacts the pad bump 136, thereby preventing or reducing the likelihood of delamination at the interface between the pad bump 136 and the via 114.

FIGS. 3-8 are partial enlarged cross-sectional views of semiconductor packages according to example embodiments of inventive concepts.

Figure 3:
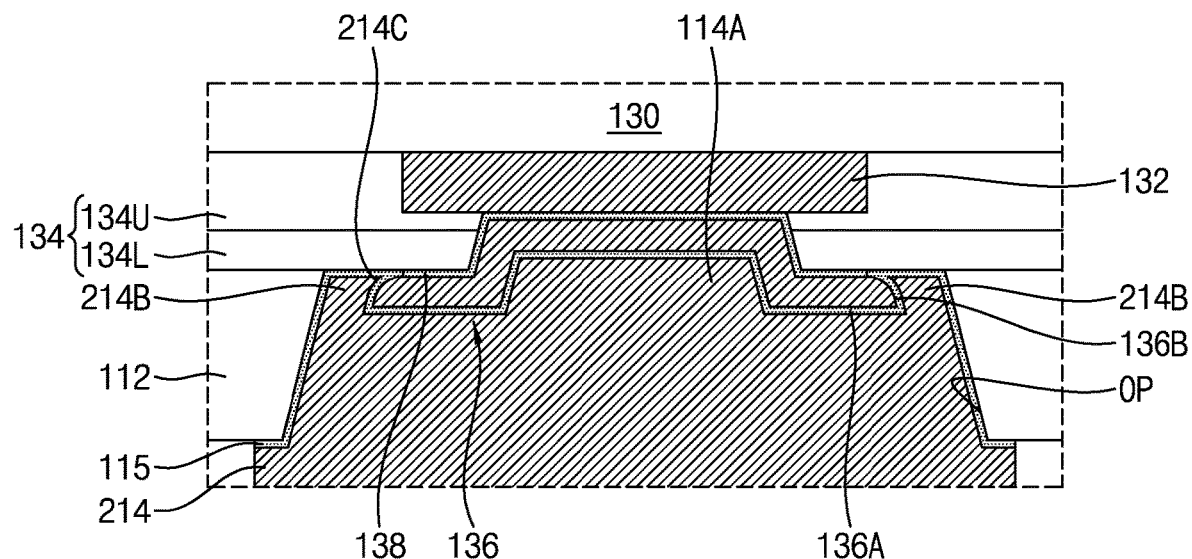
FIGS. 3-8 are partial enlarged views of the semiconductor package according to some example embodiments of the inventive concepts.

Referring to FIG. 3, a semiconductor package 200 may include a via 214 in physical contact with the lower surface 136A and the side surface 136B of the pad bump 136. The via 214 may include the central protrusion 114A and an outer protrusion 214B. In an example embodiment, the outer protrusion 214B may protrude toward the central protrusion 114A. For example, the via 214 may include a flange portion 214C extending inwardly toward the via 214 on the upper surface of the outer protrusion 214B.

Figure 4:
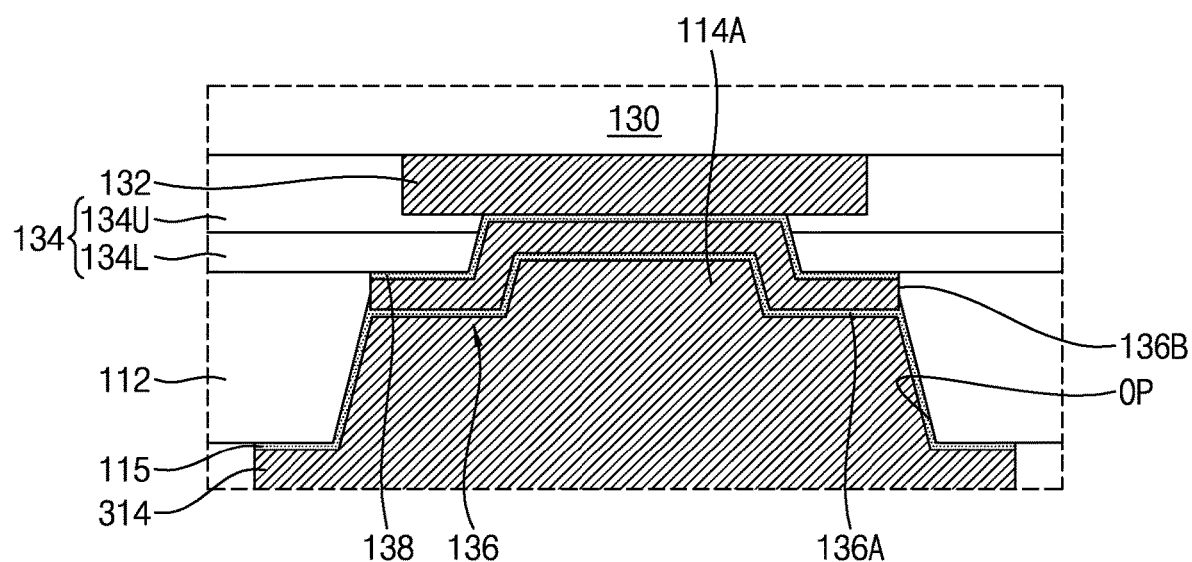

Referring to FIG. 4, a semiconductor package 300 may include a via 314 in physical contact with the lower surface 136A and the side surface 136B of the pad bump 136. In an example embodiment, the via 314 may physically contact a portion of the side surface 136B of the pad bump 136. The side surface 136B of pad bump 136 may be in physical contact with the insulating pattern 112 and the via 314. In some example embodiments, the lower passivation layer 134L may not be opened by the opening OP and may not physically contact the via 314. In addition, the via 314 may not include a configuration corresponding to the outer protrusion 114B of the semiconductor package 100 shown in FIG. 2.

Figure 5:
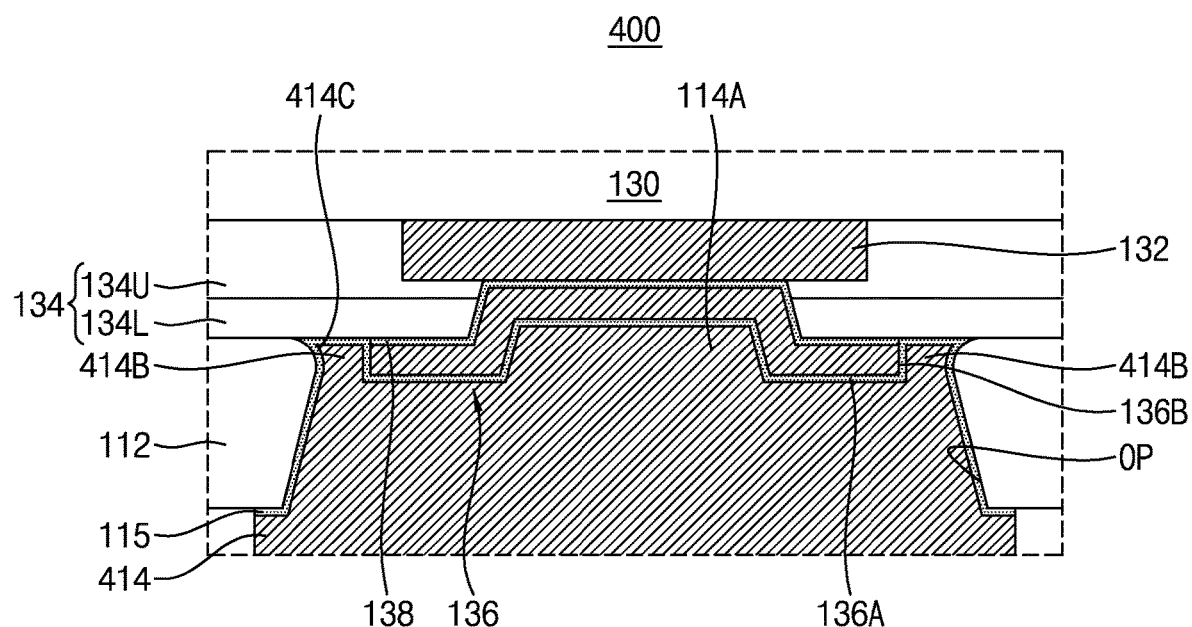

Referring to FIG. 5, a semiconductor package 400 may include a via 414 in physical contact with the lower surface 136A and the side surface 136B of the pad bump 136. The via 414 may include the central protrusion 114A and an outer protrusion 414B. In some example embodiments, the outer protrusion 414B may protrude toward the outside of the via 414. For example, the upper surface of the outer protrusion 414B may extend toward the outside of the via 414. The insulating pattern 112 may have an undercut region, and the outer protrusion 414B may at least partially fill the undercut region.

Figure 6:
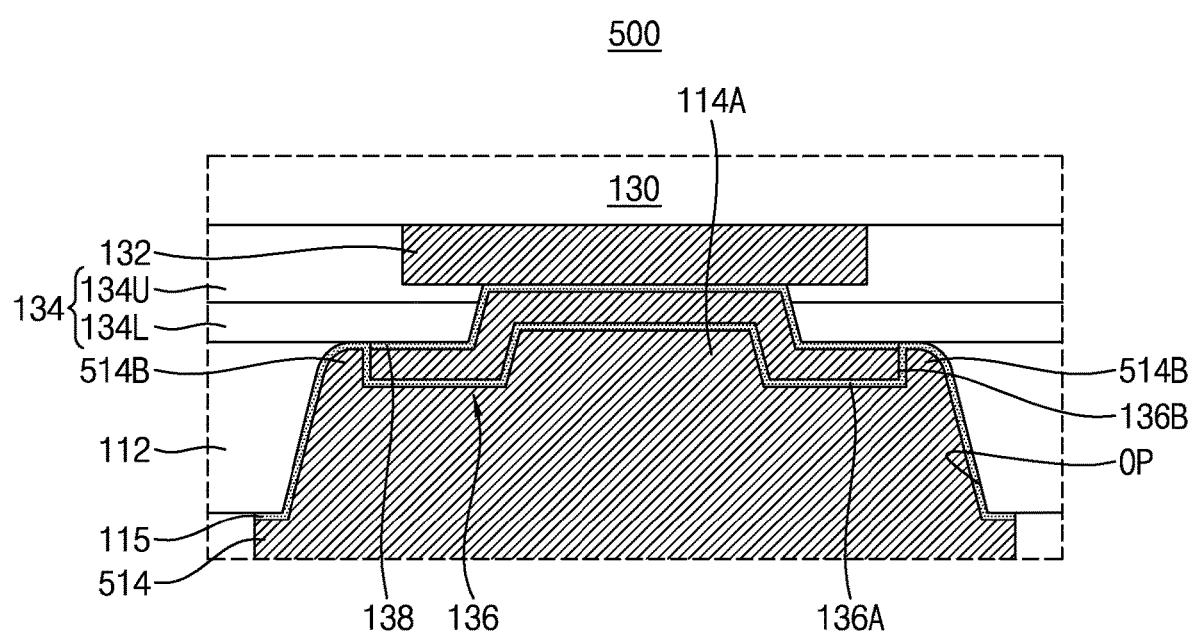

Referring to FIG. 6, a semiconductor package 500 may include a via 514 in physical contact with the lower surface 136A and the side surface 136B of the pad bump 136. The via 514 may include the central protrusion 114A and an outer protrusion 514B. In an example embodiment, the outer protrusion 514B may have an undercut area. For example, the edge of the outer protrusion 514B in physical contact with the insulating pattern 112 may be rounded. The insulating pattern 112 may at least partially fill the undercut area of the outer protrusion 514B.

Figure 7:
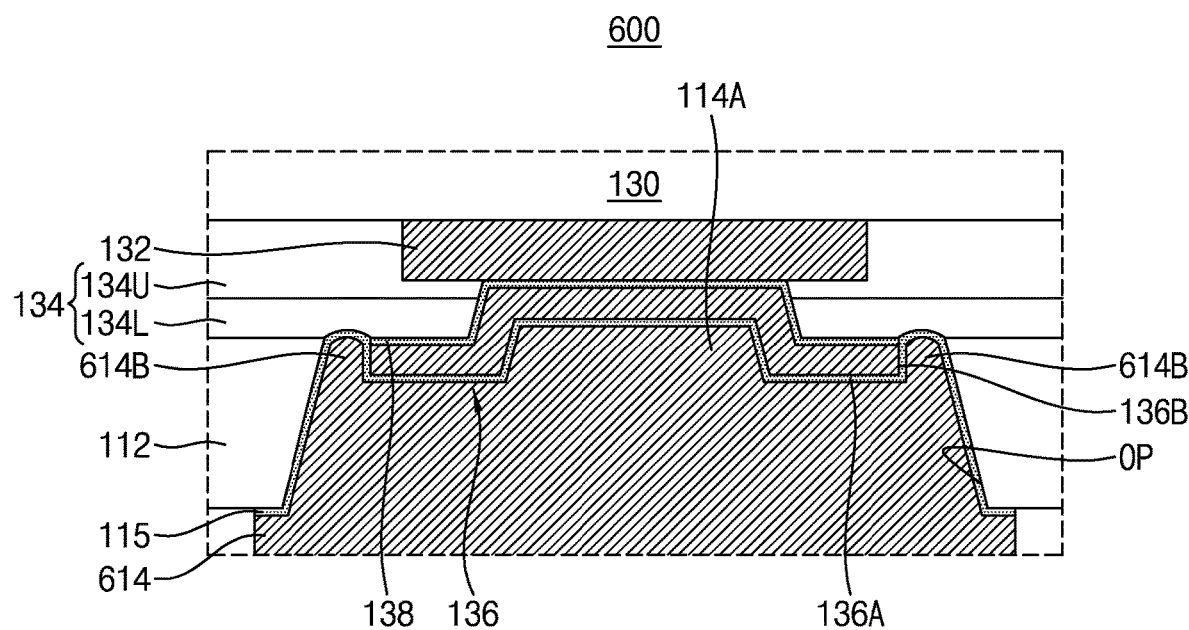

Referring to FIG. 7, a semiconductor package 600 may include a via 614 in physical contact with the lower surface 136A and the side surface 136B of the pad bump 136. The via 614 may include the central protrusion 114A and an outer protrusion 614B. The lower surface of the lower passivation layer 134L may include a recess formed in the vertical direction as shown in the cross-sectional view of FIG. 7. The recess may be formed by partially removing the lower passivation layer 134L in the process of forming the opening OP in the insulating pattern 112. In an example embodiment, the via 614 may protrude into the recess. For example, the outer protrusion 614B may protrude in the vertical direction as shown in the cross-sectional view of FIG. 7, and the upper surface of the outer protrusion 614B may be rounded. The upper end of the outer protrusion 614B may be located at a level higher than the upper end of the insulating pattern 112 as shown in the cross-sectional view of FIG. 7.

Figure 8:
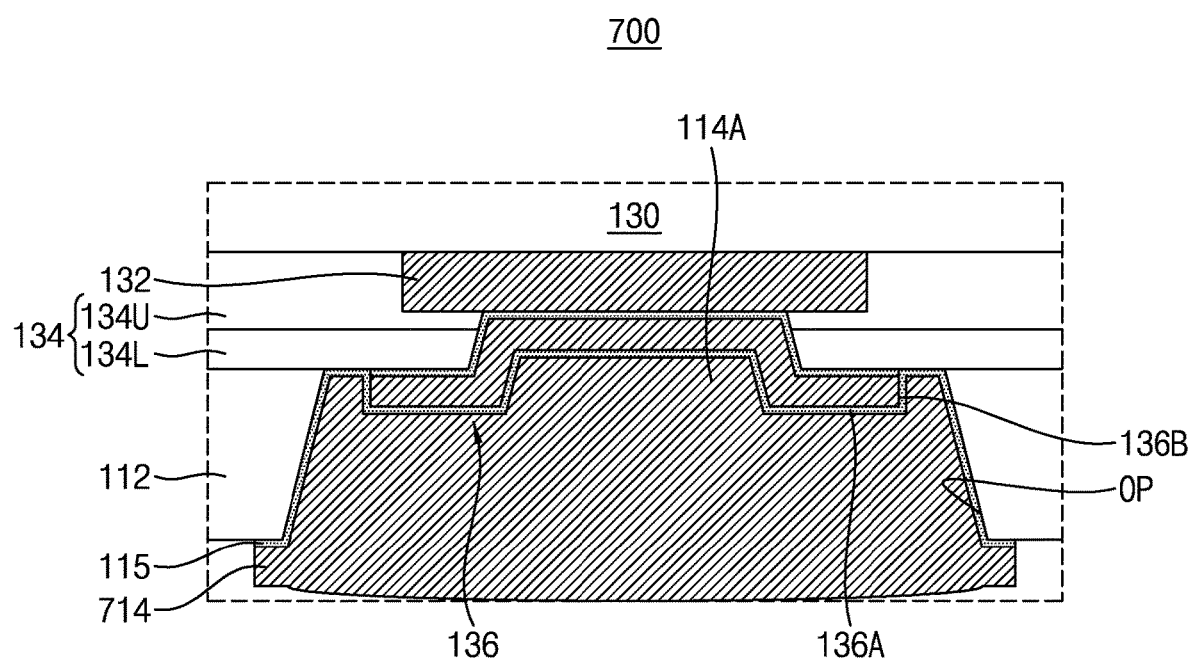

Referring to FIG. 8, a semiconductor package 700 may include a via 714 in physical contact with the lower surface 136A and the side surface 136B of the pad bump 136. In an example embodiment, the lower surface of the via 714 may be oriented convex downward as shown in the cross-sectional view of FIG. 8. The via 714 may be formed by electroplating, and the lower surface of the via 714 may have a convex shape resulting from a process of forming the via 714.

Figure 10:
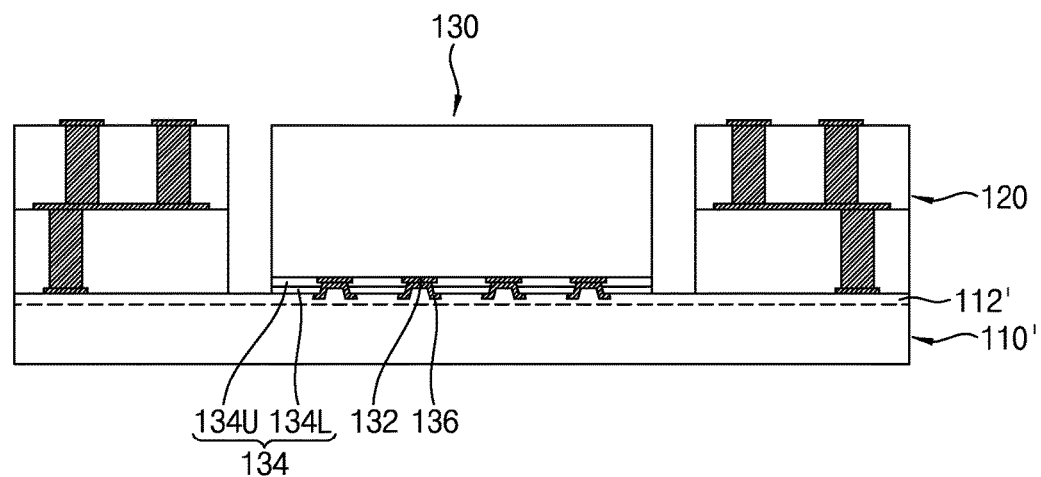
Figure 11:
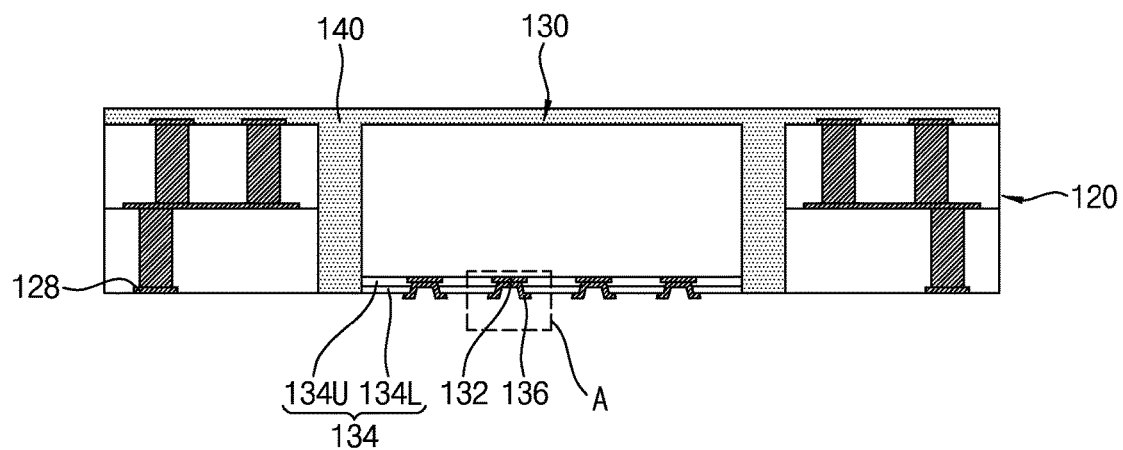
Figure 12:
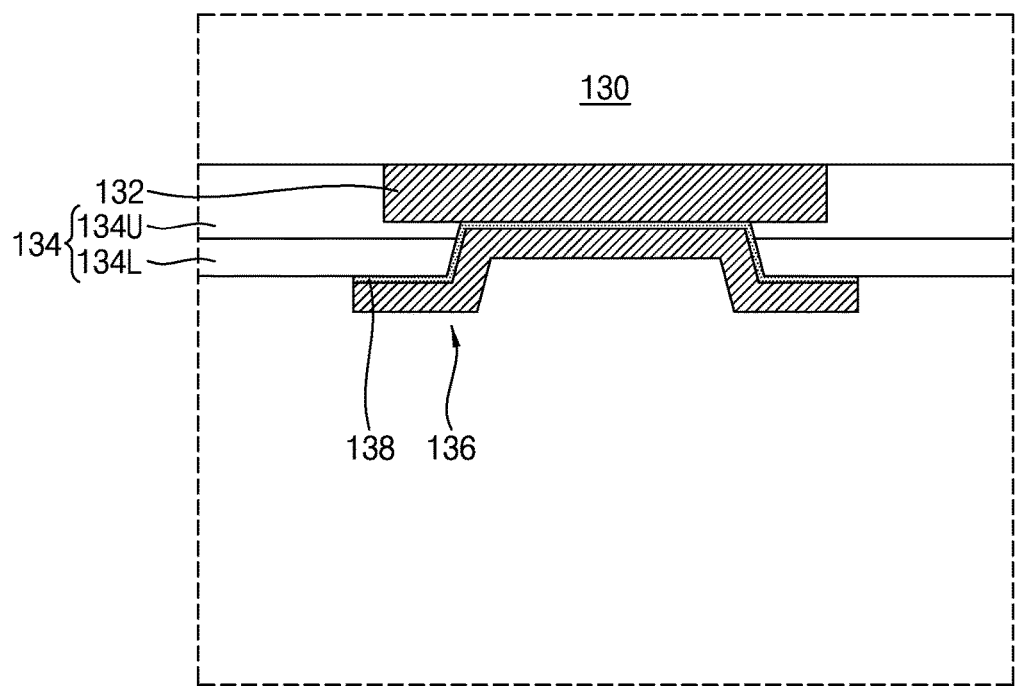
Figure 13:
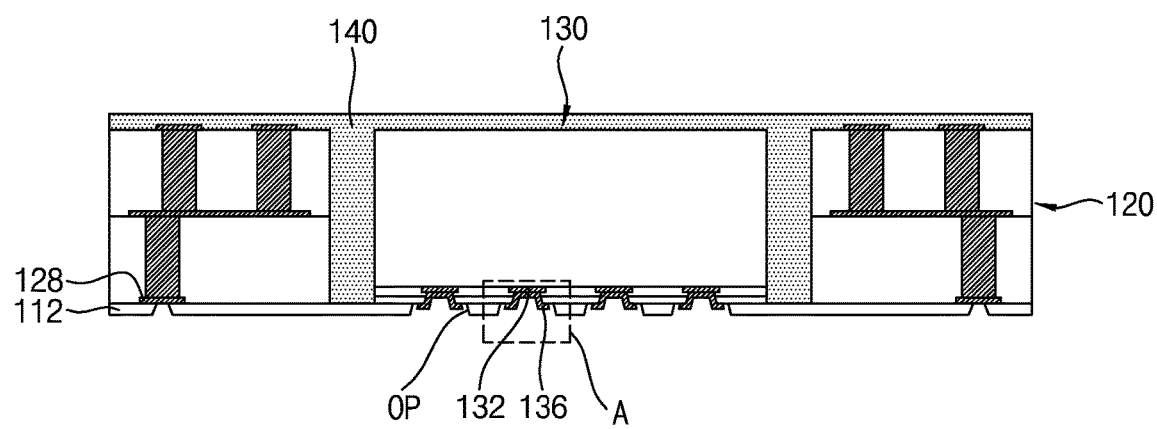
Figure 14:
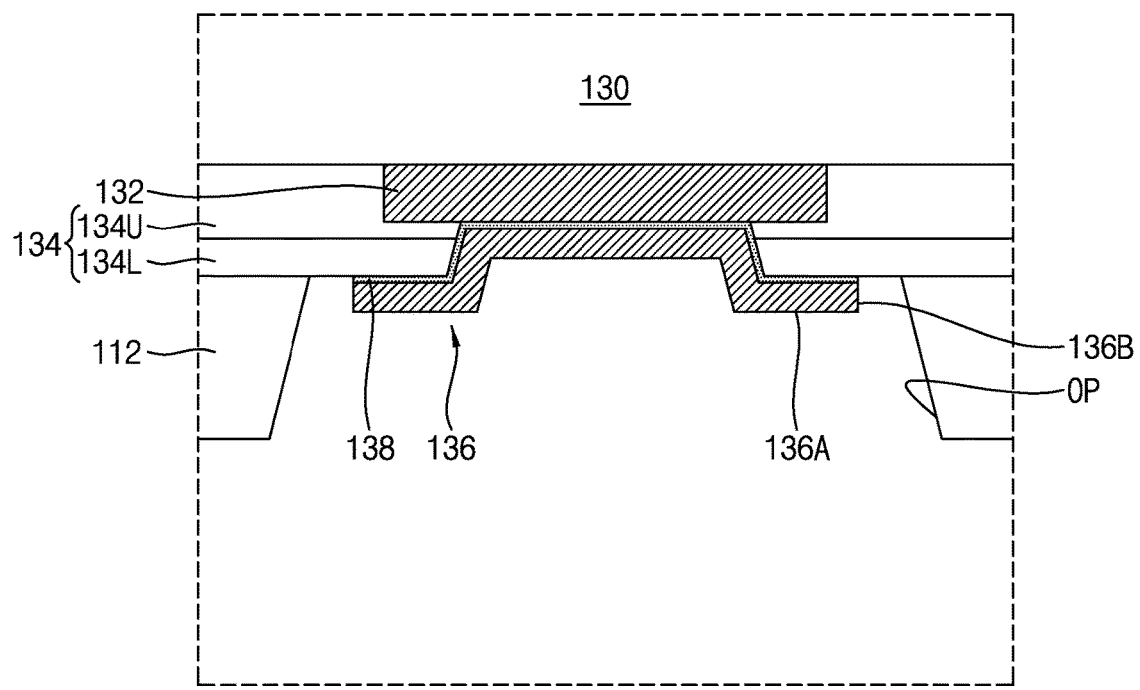
Figure 15:
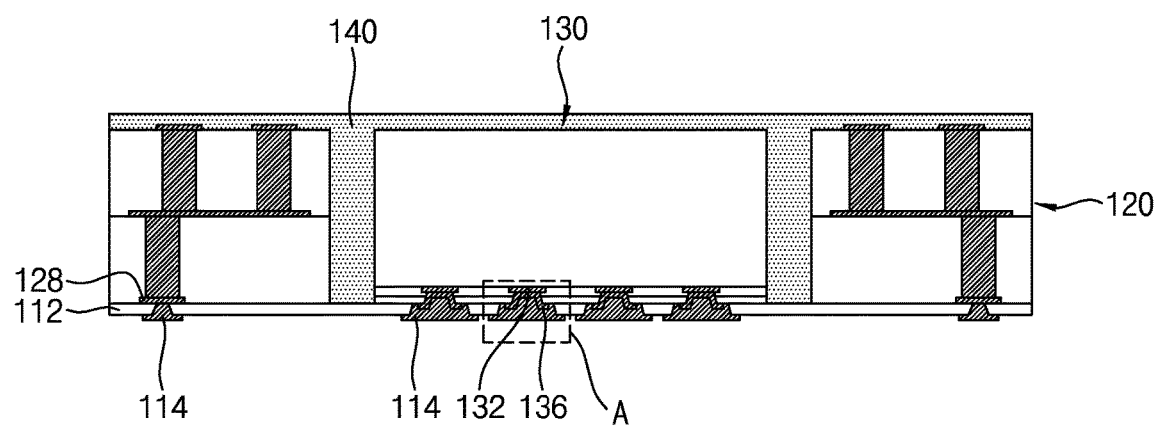
Figure 16:
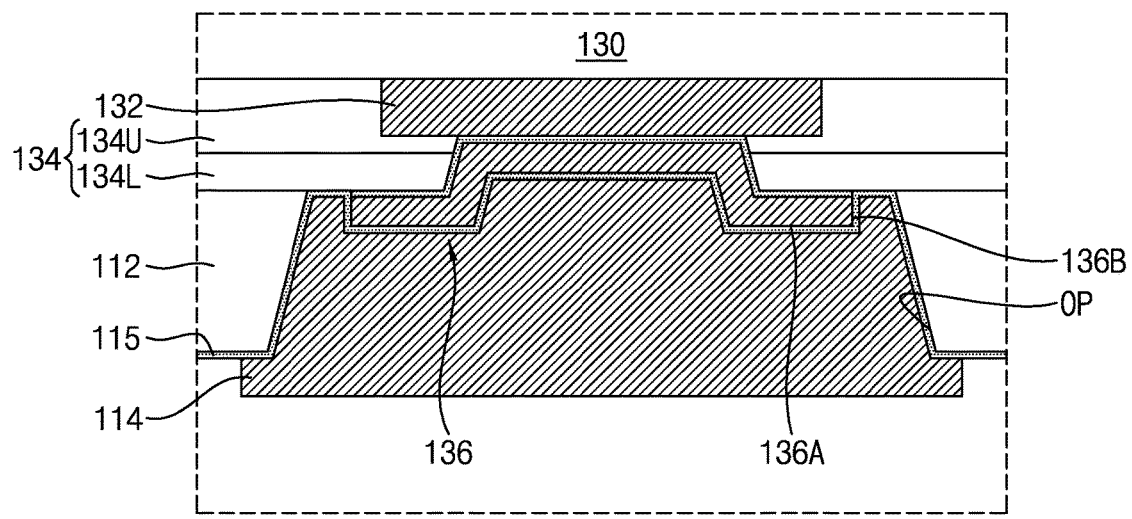

FIGS. 9-18 are vertical cross-sectional views illustrating methods of manufacturing a semiconductor package according to some example embodiments of the inventive concepts. FIGS. 12, 14, and 16 are partially enlarged views of FIGS. 11, 13, and 15, respectively, and may correspond to the area A.

Figure 9:
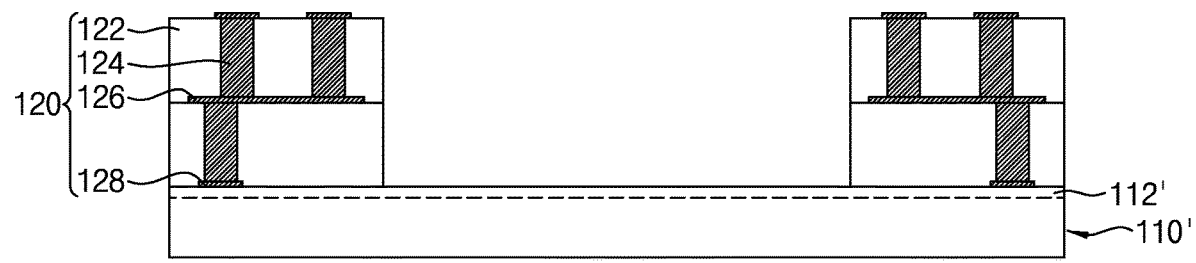
FIGS. 9-18 are vertical cross-sectional views illustrating methods of manufacturing a semiconductor package according to some example embodiments of the inventive concepts.

Referring to FIG. 9, a connection member 120 may be disposed on a carrier 110'. The connection member 120 may be attached to the carrier 110 ' by an adhesive layer 112' disposed on the upper surface of the carrier 110'. The carrier 110' may be an insulated substrate comprising glass or polymer or a conductive substrate including metal.

The connection member 120 may include an insulating layer 122, a conductive via 124, an internal wiring 126, and a conductive pad 128. In an example embodiment, the insulating layer 122 may be formed of one or more layers, and may include an insulating material. The insulating material may be a thermosetting resin, such as an epoxy resin, a thermoplastic resin, such as polyimide, or an insulating material in which these resins are impregnated with a core, such as an inorganic filler and/or glass fiber (Glass Fiber, Glass Cloth, Glass Fabric), for example, prepreg, ABF, FR-4, BT and the like. The conductive via 124 may penetrate or extend through the insulating layer 122 in a vertical direction and may be connected to the internal wiring 126 and the conductive pad 128. The internal wiring 126 may be disposed between the insulating layers 122, and may electrically connect the conductive pads 128 through the conductive vias 124. The conductive pads 128 may be connected to the conductive via 124 and may be disposed on the upper surface or lower surface of the connection member 120.

Referring to FIG. 10, a semiconductor chip 130 may be disposed adjacent to the connection member 120 on the carrier 110'. The semiconductor chip 130 may include a chip pad 132, a passivation layer 134, and a pad bump 136 on a lower surface thereof. The passivation layer 134 may include an upper passivation layer 134U and a lower passivation layer 134L disposed below the upper passivation layer 134U. The upper passivation layer 134U may be on and at least partially cover a portion of the side surface and the upper surface of the chip pad 132. The lower passivation layer 134L may be disposed below the upper passivation layer 134U, i.e., between the upper passivation layer 134U and the carrier 110'. The upper passivation layer 134U and the lower passivation layer 134L may expose a portion of the lower surface of the chip pad 132. The pad bump 136 may be connected to a portion of the exposed lower surface of the chip pad 132.

In an example embodiment, the chip pad 132 may include aluminum. The upper passivation layer 134U may include an insulating material, such as silicon oxide and silicon nitride. The lower passivation layer 134L may include an insulating material, such as photosensitive polyimide (PSPI), silicon oxide, and silicon nitride.

Referring to FIGS. 11 and 12, an encapsulant 140 may be formed on and to at least partially cover the carrier 110', the connection member 120, and the semiconductor chip 130. The encapsulant 140 may at least partially fill a space between the connection member 120 and the semiconductor chip 130. The encapsulant 140 may include an epoxy molding compound. Thereafter, the carrier 110' connected to the connection member 120 and the lower portion of the semiconductor chip 130 may be removed. The conductive pad 128 of the connection member 120 and the pad bump 136 of the semiconductor chip 130 may be exposed. The pad bump 136 may include a seed layer 138 on its upper surface. The seed layer 138 may be conformally formed along the surfaces of the chip pad 132, the upper passivation layer 134U, and the lower passivation layer 134L. The seed layer 138 may include two or more layers. In an example embodiment, the seed layer 138 may include a first seed layer comprising titanium and a second seed layer disposed below the first seed layer, i.e., between the first seed layer and the pad bump 136, and comprising copper.

Referring to FIGS. 13 and 14, an insulating pattern 112 may be formed on a lower surface of the connection member 120, a lower surface of the semiconductor chip 130, and a lower surface of the encapsulant 140. The insulating pattern 112 may be formed by forming an insulating layer on and at least partially covering the lower surface of the connection member 120 and the lower surface of the semiconductor chip 130 and patterning the insulating layer. An opening OP may be formed in the insulating pattern 112 by a patterning process. The patterning process may be performed by an exposure and development process. In an example embodiment, the insulating pattern 112 may include a photosensitive insulating material, such as a photo imaginable dielectric resin (PID).

The opening OP may expose the conductive pad 128 and the pad bump 136 of the connection member 120. In an example embodiment, the opening OP may open or define the lower surface 136A and the side surface 136B of the pad bump 136. In addition, the opening OP may expose a portion of the lower passivation layer 134L. In an example embodiment, a recess may be formed in the lower surface of the lower passivation layer 134L by a patterning process.

Referring to FIGS. 15 and 16, a seed layer 115 may be conformally formed in the lower surface of the insulating pattern 112 and in the opening OP. The seed layer 115 may include two or more layers. In an example embodiment, the seed layer 115 may include a first seed layer comprising titanium and a second seed layer disposed below the first seed layer, i.e., between the first seed layer and the via 114, and comprising copper. In an example embodiment, the seed layer 115 may further comprise Ni. For example, the seed layer 115 may include Ti/Cu/Ni or an alloy thereof. Thereafter, a via 114 may be formed in the openings OP using the mask pattern. The via 114 may be formed by a plating process using the seed layer 115, and may include a metal, such as copper. A portion of the seed layer 115 not covered by the vias 114 may be removed by an etching process.

In an example embodiment, the via 114 may at least partially fill the opening OP and may physically contact the conductive pad 128 and pad bump 136. For example, the via 114 may physically contact the lower surface 136A and side surface 136B of the pad bump 136. In addition, the via 114 may physically contact the lower surface of the lower passivation layer 134L.

Figure 17:
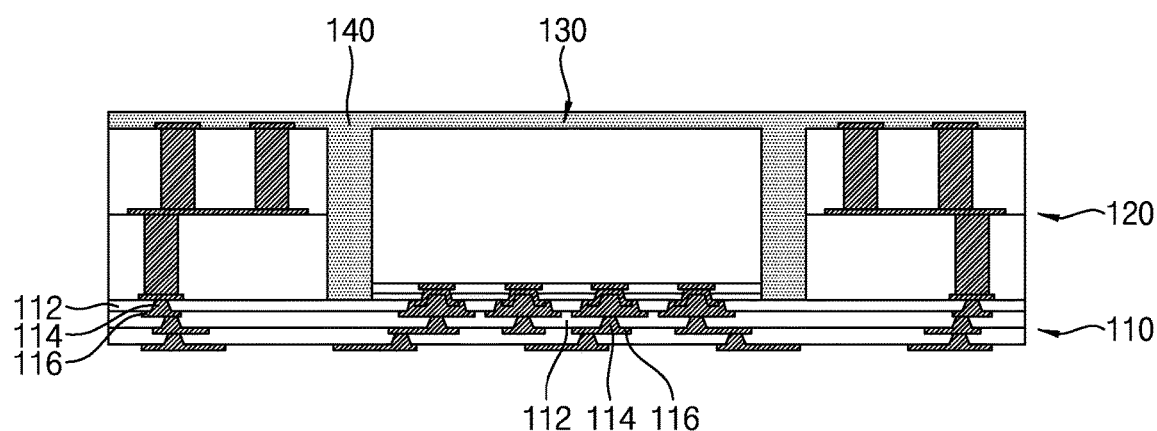

Referring to FIG. 17, a lower redistribution layer 110 may be formed on the lower surface of the insulating pattern 112. The lower redistribution layer 110 may include a plurality of layers, and may include the insulating patterns 112, the vias 114, and the wiring patterns 116. As shown in FIG. 17, the lower redistribution layer 110 may be formed by repeating the process of forming the insulating pattern 112 and the via 114. The wiring pattern 116 may be disposed between the insulating patterns 112 and may extend in the horizontal direction in the cross-sectional view of FIG. 17. The vias 114 may electrically connect the wiring patterns 116 of different layers, and may be integrally formed with the corresponding wiring patterns 116. The wiring pattern 116 may include the same material as the via 114, for example, copper.

Figure 18:
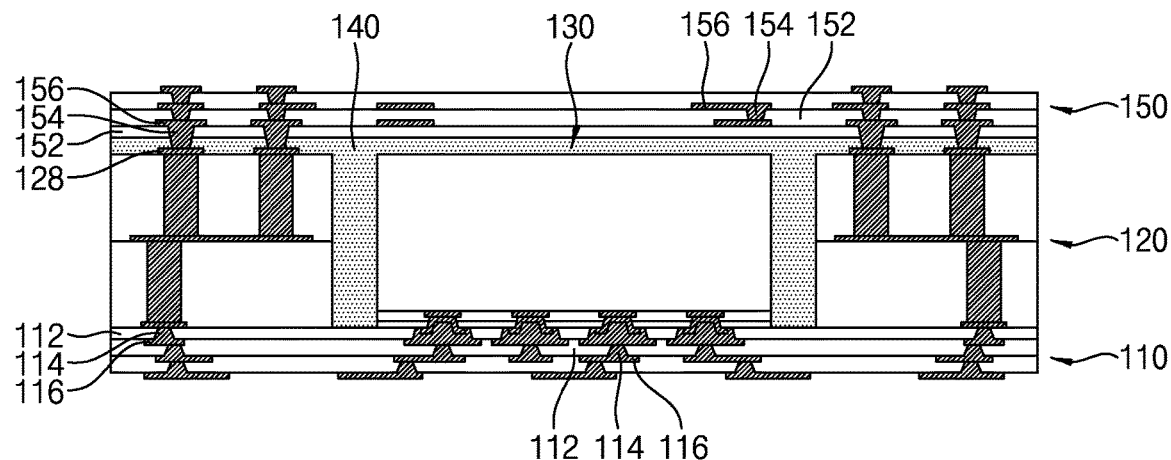

Referring to FIG. 18, an upper redistribution layer 150 may be formed on the encapsulant 140. The upper redistribution layer 150 may include a plurality of layers, and may include insulating patterns 152, vias 154, and wiring patterns 156. The insulating pattern 152 of the upper redistribution layer 150 may be on and at least partially cover the upper surface of the encapsulant 140. The via 154 may be connected to conductive pad 128 of connecting member 120.

Referring back to FIG. 1, an upper package 20 may be formed on a lower package 10, and an external connection terminal 160 may be formed on a lower surface of the lower redistribution layer 110. The upper package 20 may include a substrate 170, a semiconductor chip 174, an encapsulant 176, and a connection terminal 178. In an example embodiment, a redistribution layer may be used as the substrate 170. The substrate 170 may include connection pads 172 disposed on a lower surface and an upper surface thereof and electrically connected to each other. The semiconductor chip 174 may be mounted on the substrate 170. The semiconductor chip 174 may be provided on the substrate 170 by wire bonding or flip chip bonding. The semiconductor chip 174 may be electrically connected to the connection pad 172 of the substrate 170. The encapsulant 176 may be on and at least partially cover the substrate 170 and the semiconductor chip 174. The connection terminal 178 may be disposed below the substrate 170 and may be electrically connected to the connection pad 172. The lower package 10 may be electrically connected to the upper package 20 through the connection terminal 178.

The external connection terminal 160 may be electrically connected to the wiring pattern 116 and the via 114, and may be electrically connected to the semiconductor chip 130 through the lower redistribution layer 110. The lower package 10 may be manufactured by forming an external connection terminal 160 in the lower redistribution layer 110.

Figure 19:
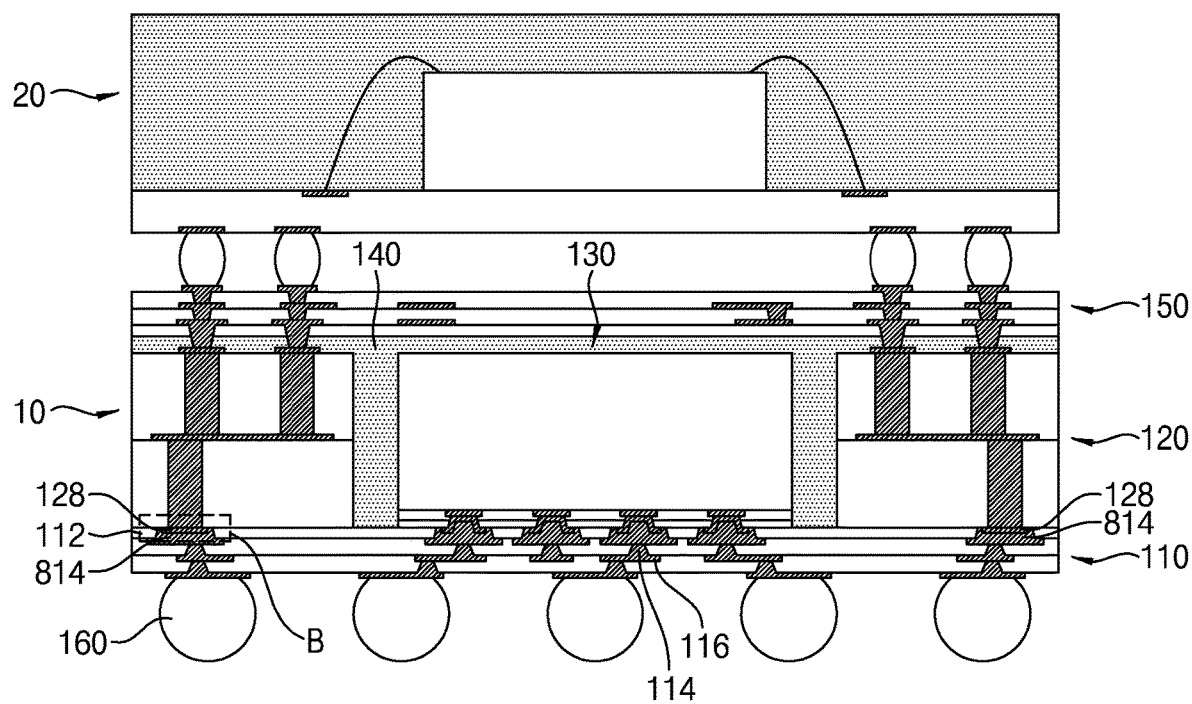
FIG. 19 is a vertical cross-sectional view of the semiconductor package according to some example embodiments of the inventive concepts.
Figure 20:
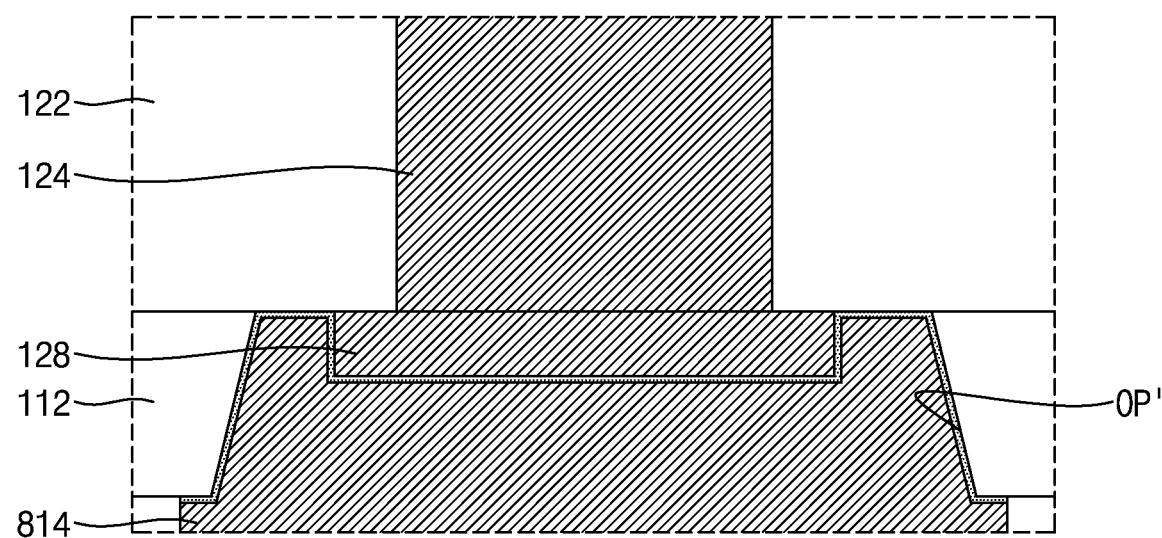
FIG. 20 is a partial enlarged view of the semiconductor package shown in FIG. 19.

FIG. 19 is a vertical cross-sectional view of the semiconductor package according to some example embodiments of the inventive concepts. FIG. 20 is a partial enlarged view of the semiconductor package shown in FIG. 19. FIG. 20 may correspond to area B of FIG. 19.

Referring to FIGS. 19 and 20, a semiconductor package 800 may further include an opening OP' formed in the insulating pattern 112 and a via 814 at least partially filling the opening OP'. The opening OP' may open the insulating layer 122 and the conductive pad 128. For example, the opening OP' may open or define the lower surface of the insulating layer 122 and may open or define the lower surface and the side surface of the conductive pad 128. In an example embodiment, the via 814 may physically contact the insulating layer 122 and conductive pad 128. For example, the via 814 may physically contact the lower and side surface of the conductive pad 128. The upper surface of the via 814 may be located at the same level as the upper surface of the conductive pad 128 in the cross-sectional views of FIGS. 19 and 20. The via 814 may be located at the same level as the via 114 in the cross-sectional view of FIG. 19. The horizontal width of the portion where the via 814 physically contacts the insulating layer 122 may be greater than the horizontal width where the conductive pad 128 physically contacts the insulating layer 122. As shown in FIG. 20, because the area where the via 814 physically contacts the conductive pad 128 is large, delamination at the interface between the conductive pad 128 and the via 814 can be prevented and reduced.

According to example embodiments of inventive concepts, a via may have an increased contact area with a pad bump, thereby preventing or reducing the likelihood of delamination at the interface between the via and the pad bump.

While embodiments of inventive concepts have been described with reference to the accompanying drawings, it should be understood by those skilled in the art that various modifications may be made without departing from the scope of inventive concepts and without changing essential features thereof. Therefore, the above-described embodiments should be considered in a descriptive sense only and not for purposes of limitation.

What is claimed is:

1. A semiconductor package comprising:
a lower redistribution layer including an insulating pattern having an opening and a via in the opening;
a first semiconductor chip on the lower redistribution layer, the first semiconductor chip including a chip pad on a lower surface of the first semiconductor chip, a passivation layer, and a pad bump, the pad bump extending through the passivation layer and being connected to the chip pad; and
a first encapsulant on the lower redistribution layer and the first semiconductor chip,
wherein the opening of the insulating pattern defines a lower surface and an outer side surface of the pad bump, and
wherein the via includes a central protrusion in physical contact with the lower surface of the pad bump; a first portion in physical contact with a lower surface of the passivation layer and the outer side surface of the pad bump; and a second portion spaced apart from the passivation layer.

2. The semiconductor package according to claim 1, wherein the second portion physically contacts a portion of the outer side surface of the pad bump.

3. The semiconductor package according to claim 1, wherein the via further includes a flange portion on an upper surface of the first portion, the flange portion extending toward the via.

4. The semiconductor package according to claim 1, wherein the via further includes a flange portion on an upper surface of the first portion, the flange portion extending away from the via.

5. The semiconductor package according to claim 1, wherein an edge of the first portion in physical contact with the insulating pattern is rounded.

6. The semiconductor package according to claim 1, wherein the passivation layer includes a recess formed at a location where a portion of the passivation layer meets the first portion, and
wherein the first portion protrudes into the recess.

7. The semiconductor package according to claim 1, wherein the via physically contacts a portion of the outer side surface of the pad bump, and
wherein the insulating pattern physically contacts a remaining portion of the outer side surface of the pad bump.

8. The semiconductor package according to claim 1, wherein a lower surface of the via has a convex shape extending toward the lower redistribution layer.

9. The semiconductor package according to claim 1, wherein, in a cross-sectional view of the semiconductor package, a horizontal width of a portion of the via in physical contact with the passivation layer is greater than a horizontal width of the pad bump.

10. The semiconductor package according to claim 1, wherein the via further includes a seed layer conformally formed along an upper surface of the via.

11. The semiconductor package according to claim 10, wherein the seed layer is on the lower surface and the outer side surface of the pad bump.

12. The semiconductor package according to claim 10, wherein the seed layer is on a portion of a lower surface of the passivation layer.

13. The semiconductor package according to claim 1, further comprising:
a connection member on the lower redistribution layer adjacent to the first semiconductor chip; and
an upper redistribution layer on an upper surface of the first encapsulant and electrically connected to the connection member.

14. The semiconductor package according to claim 13, further comprising an upper package on the upper redistribution layer including a substrate, a second semiconductor chip, a second encapsulant, and a connection terminal, wherein the upper package is electrically connected to the upper redistribution layer through the connection terminal.

15. A semiconductor package comprising:
a lower redistribution layer including an insulating pattern having a first opening and a second opening, a first via in the first opening, and a second via in the second opening;
a first semiconductor chip on the lower redistribution layer, the first semiconductor chip including a chip pad, a passivation layer, and a pad bump, the pad bump extending through the passivation layer and being connected to the chip pad;

a first encapsulant on the lower redistribution layer and the first semiconductor chip, and a connection member on the lower redistribution layer adjacent to the first semiconductor chip, the connection member including an insulating layer and a conductive pad between the insulating layer and the lower redistribution layer, wherein the second opening defines a lower surface and a side surface of the conductive pad, and the second via is in physical contact with the insulating layer and the lower surface of the conductive pad and at least a portion of the side surface of the conductive pad.

16. The semiconductor package according to claim 15, wherein, in a cross-sectional view of the semiconductor package, a horizontal width of a portion of the second via in physical contact with the insulating layer is greater than a horizontal width of the conductive pad.

17. The semiconductor package according to claim 15, wherein, in a cross-sectional view of the semiconductor package, the second via and the first via are on a same level.

18. The semiconductor package according to claim 15, further comprising an upper redistribution layer on an upper surface of the first encapsulant and electrically connected to the connection member.

19. A semiconductor package comprising:

a lower package comprising:

a lower redistribution layer including an insulating pattern having an opening and a via in the opening;

a first semiconductor chip on the lower redistribution layer, the first semiconductor chip including a chip pad, a passivation layer, and a pad bump, the pad bump extending through the passivation layer and being connected to the chip pad;

a connection member on the lower redistribution layer adjacent to the first semiconductor chip;

a first encapsulant on the lower redistribution layer and the first semiconductor chip; and an upper redistribution layer on an upper surface of the first encapsulant and electrically connected to the connection member, wherein the via physically contacts a portion of the outer side surface of the pad bump, wherein the insulating pattern physically contacts a remaining portion of the outer side surface of the pad bump, and wherein the via includes a central protrusion in physical contact with the lower surface of the pad bump; a first portion in physical contact with a lower surface of the passivation layer and the outer side surface of the pad bump; and a second portion spaced apart from the passivation layer.

20. The semiconductor package according to claim 19, wherein, in a cross-sectional view of the semiconductor package, a horizontal width of a portion of the via in physical contact with the passivation layer is greater than a horizontal width of the pad bump.

* * * * *